Figure 1:
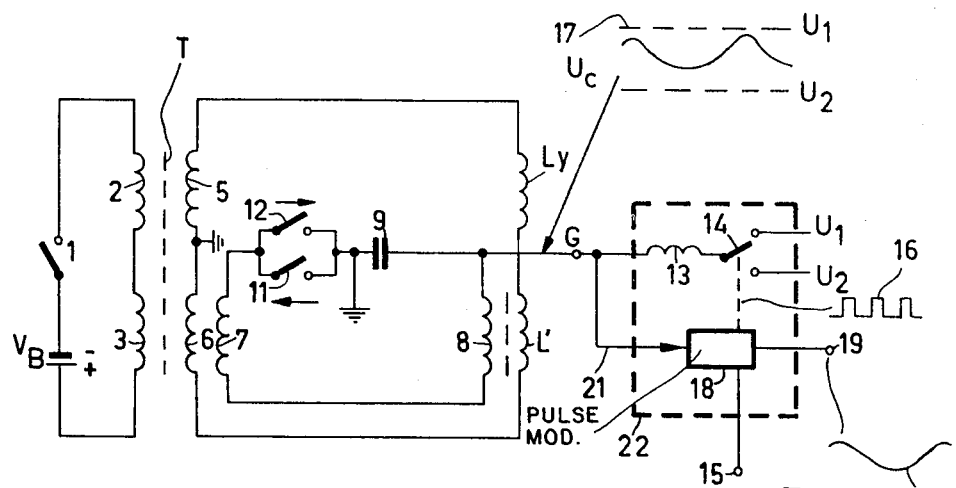

United States Patent [19]

Wölber

[11] 4,118,655
[45] Oct. 3, 1978

[54] LINE SAWTOOTH DEFLECTION CURRENT GENERATOR

[75] Inventor: Jörg Wölber, Pinneberg, Fed. Rep. of Germany

[73] Assignee: U.S. Philips Corporation, New York, N.Y.

[21] Appl. No.: 799,961

[22] Filed: May 24, 1977

[30] Foreign Application Priority Data

May 26, 1976 [DE] Fed. Rep. of Germany ........ 2623599

[51] Int. Cl.² ............................................. H01J 29/56
[52] U.S. Cl. ................................................. 315/371
[58] Field of Search ......................................... 315/371

[56] References Cited

U.S. PATENT DOCUMENTS

| 3,648,099 | 3/1972 | Otten et al. | 315/371 |
| 3,676,733 | 7/1972 | Eulenberg | 315/371 |
| 3,697,801 | 10/1972 | Eulenberg | 315/371 |
| 3,823,340 | 7/1974 | Ketelaar | 315/371 X |
| 3,879,636 | 4/1975 | Lamoureux | 315/371 |
| 3,914,650 | 10/1975 | Verbežj | 315/371 |
| 4,024,432 | 5/1977 | Boekhorst | 315/371 |

FOREIGN PATENT DOCUMENTS

| 2,132,516 | 2/1972 | Fed. Rep. of Germany | 315/371 |
| 1,424,229 | 12/1966 | France | 315/371 |

Primary Examiner—Malcolm F. Hubler
Attorney, Agent, or Firm—Frank R. Trifari; Henry I. Steckler

[57] ABSTRACT

A line sawtooth deflection current generator with modulating means for the purpose of correcting the amplitude variations of the current produced, the said modulating means including a stage operating in the switching mode, a switch of which is connected via a smoothing inductance. A winding coupled to an inductance in the deflection circuit is provided in the branch of the smoothing inductance between the scan capacitor and the switch.

3 Claims, 2 Drawing Figures

LINE SAWTOOTH DEFLECTION CURRENT GENERATOR

The invention relates to a circuit arrangement for generating a sawtooth deflection current through a line deflection coil comprising switching means operating at line frequency for periodically applying a voltage to a line deflection coil circuit for the production of said deflection current and modulating means connected to said deflection coil circuit for modulating the magnitude of the voltage across the deflection coil during the line scan period thereby modulating the amplitude of the deflection current, said modulating means including a stage operating in the switching mode.

Such a circuit arrangement is described in co-pending U.S. patent application Ser. No. 754,968, filed Dec. 27, 1976. For the purpose of correcting distortion in the horizontal direction of the image displayed in television display apparatus the line deflection current is modulated at field frequency, the field frequency variation being parabola-shaped over each field scan period. This modulation is known as East-West-modulation and can be used to correct for pin-cushion distortion in the displayed image in the East-West-direction. The modulator and the line deflection circuit are coupled with one another in such a way that the deflection current actually undergoes the modulation referred to but also in such a way that the pulses occurring in a line output transformer during the line flyback of the deflection current are not influenced. Direct voltages obtained by rectification of the said pulses, for example the extra high tension for the final anode of the image display tube, are therefore not modulated at field frequency.

In the above mentioned patent application a modulation source is connected to modulating terminals, the modulating means including a stage operating in the switching mode for the purpose of saving energy.

It is an object of the invention to provide an improved circuit arrangement of the same kind in which some components may be cheaper and in which some drawbacks are mitigated.

The invention provides a circuit arrangement for generating a sawtooth deflection current through a line deflection coil comprising switching means operating at line frequency for periodically applying a voltage to a line deflection coil circuit for the production of said deflection current and modulating means connected to said deflection coil circuit for modulating the magnitude of the voltage across the deflection coil during the line scan period thereby modulating the amplitude of the deflection current, said modulating means including a stage operating in the switching mode with a switch controlled by periodic pulses for alternately driving said switch into conduction and cutting it off and adjusting the duration of the controlling pulses depending on the voltage present at modulating output terminals, a reference voltage being connected to a scan capacitor for supplying a part of the voltage applied to the line deflection coil, and a pulse-shaped current being switched between two values and flowing to the scan capacitor via an inductance for smoothing the switching frequency, whereby a winding is provided in the branch of the smoothing inductance between the scan capacitor and the switchmodulator which winding is coupled to an inductance in the deflection circuit.

The invention additionally provides television display including a circuit arrangement of the type above described.

Figure 2:
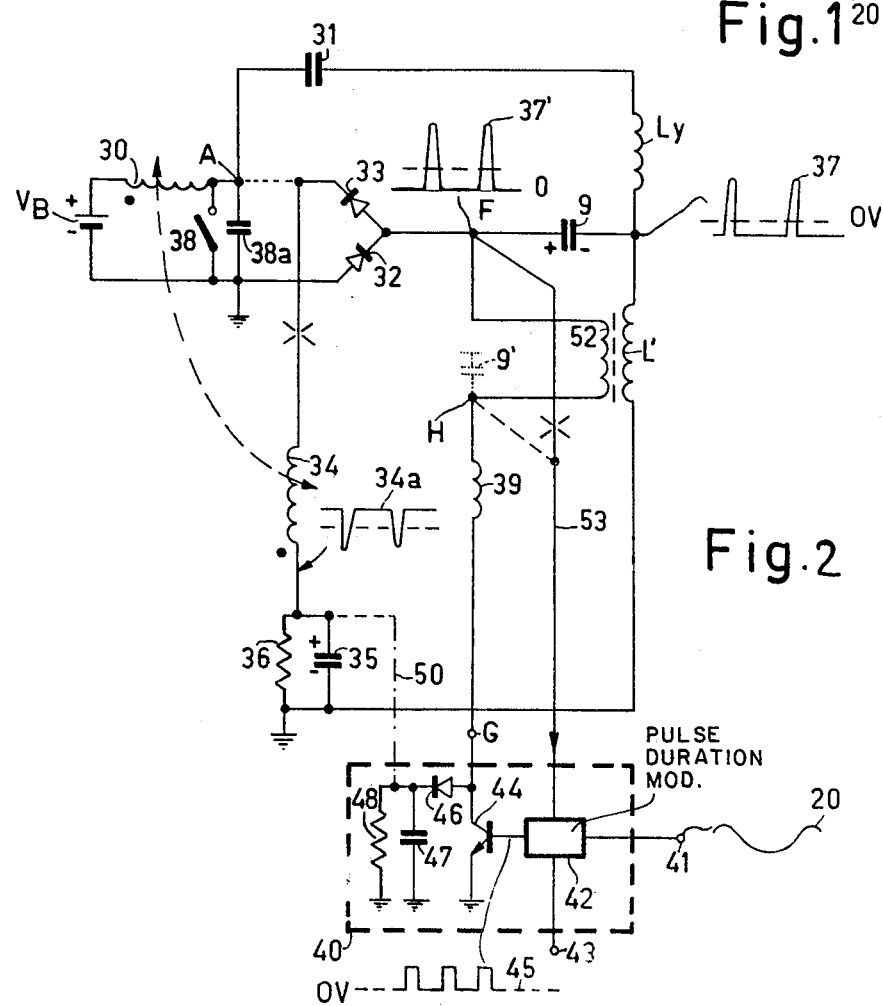

The above and other features of the invention will be more readily understood by a perusal of the following description having reference by way of example to the accompanying drawings:

FIG. 1 shows a simplified diagram of a circuit arrangement according to the above-mentioned patent application, and FIG. 2 is a diagrammatic representation showing an embodiment of a circuit arrangement according to the invention.

FIG. 1 shows a prior art line deflection circuit in a television receiver, not shown. Herein a supply voltage source $V_B$ is connected in series with a switch 1, which is closed during the line scan period and a primary winding, which consists of two sections 2 and 3, of a line output transformer T. This transformer comprises two series-connected secondary windings 5 and 6 to which the deflection coil Ly and a compensation coil L' are connected in series. Consequently, when switch 1 is closed the transformed supply voltage $V_B$ is applied to the series circuit of the inductances Ly and L'. A point of the circuit 5, 6, Ly, L', for example the junction of windings 5 and 6 is connected to ground.

The line transformer T comprises a further secondary winding 7, a secondary winding 8 being coupled to the compensation coil L', the ends which are represented at the bottom in FIG. 1 being interconnected. Between the other ends of the windings 7 and 8 there is the series connection of a capacitor 9 and a switch which is closed during the trace, which switch is constituted by the parallel arrangement of two switches 11 and 12 which alternately conduct only in one current direction in accordance with the arrows shown. One of these switches, which carries a current during the beginning of the trace may be realized by means of a diode, the other switch which is open at the end of the trace can be realized by means of a transistor which is correspondingly driven from, for example, line transformer T.

The transformation ratios for the windings 7 and 8 are chosen such that the voltage induced at them by the scanning current which flows through the circuits 5, 6, Ly, L' are substantially equal, so that between their ends, which are shown in the upper part of FIG. 1, no voltage difference is produced during the scan when capacitor 9 is lacking; consequently these ends constitute the terminal points of a bridge diagonal. If switch 11, 12 is closed during the scan the voltage of capacitor 9 in the series circuit of windings 7 and 8 becomes operative in such a manner that during the scan the series arrangement of the transformer supply voltage $V_B$ and of the transformed voltage $U_c$ of capacitor 9 is connected to the line deflection coil Ly. Consequently, the current through the coil Ly is influenced in accordance with the voltage $U_c$. However, owing to the bridge circuit the action on transformer T is eliminated so that the first generator which is constituted by the voltage source $V_B$ and the switch 1 is decoupled with respect to the second generator which is constituted by the capacitor 9 and switch 11, 12 and conversely.

The circuit of windings 7 and 8, capacitor 9 and switch 11, 12 is D.C., isolated from the deflection circuit proper; consequently it can be grounded in any desired place and the sequence of its elements may be interchanged. In FIG. 1 it is grounded between switches 11, 12 and capacitor 9. Consequently capacitor 9 can be supplied with a voltage with respect to earth which must be fed to the non-grounded terminal G in view of the desired modulation. In prior art circuits the emitter output of a transistor-D.C. voltage amplifier is connected at terminal G to whose base the desired modulating voltage is applied and whose collector is connected to a voltage source. This causes a considerable power loss.

According to the invention the point G is connected via an inductance 13 to the tongue of a commutator 14, one switching contact of which is connected to a voltage $U_1$ and whose other switching contact to a voltage $U_2$. If now the tongue of switch 14 is periodically, for example at line frequency, switched over an alternating current flows to and from capacitor 9 respectively and it depends on the duty cycle, so on the time ratio in which the switch is connected to the voltage $U_1$ to the time in which the switch is connected to the voltage $U_2$ which average D.C. voltage value is produced and fed to capacitor 9 via point G. Depending on the duty cycle the voltage $U_c$ upon capacitor 9 may assume any desired value between the limit values $U_1$ and $U_2$. Herein the one voltage ($U_1$) must be greater (for example more positive) than the largest (most positive) desired capacitor voltage $U_c$ whilst the other voltage ($U_2$) must be lower (more negative) than the lowest desired capacitor voltage $U_c$. The periodic position of switch 14, which may be an electronic switch, is shown in diagram 16 in the form of square pulses which correspond to the voltage at the switching tongue. So the width of these pulses must be changed according to the desired field frequency voltage variation so that in accordance with the variation which is shown at 17 in a highly compressed time scale, a voltage is obtained at point G which is at field frequency and approximately parabolic, which voltage is situated within the limit values resulting from the voltages $U_1$ and $U_2$. The voltage produced thereby at capacitor 9 is added to the scan voltage which is supplied by the first generator ($V_B$, 1) via the transformer T so that the line length is modulated. An approximately sawtooth alternating current which charges and then discharges capacitor 9 in each period flows through windings 7, 8 which are connected to the capacitor voltage $U_c$ by means of switch 11, 12 so that terminal G need only supply enough current to compensate for the unavoidable losses in the sawtooth circuit. Capacitor 9 is of such a value that its voltage $U_c$ does not show noticeable voltages of line frequency.

The voltage, transformation ratios and inductances are chosen within the framework of knowledge of one skilled in the art wherein also the voltages $U_1$ and $U_2$ are fixed; preferably an available auxiliary voltage is utilised for the one value whereas the other voltage may correspond to the reference potential (chassis or earth).

A pulse modulator 18 which is controlled by a signal at line frequency which is applied to a terminal 15 can effect a time-modulated pulse control for switch 14 in accordance with diagram 16. The modulator is controlled by a parabolic signal 20 at field frequency which is applied at a terminal 19 and which corresponds to the voltage variation at capacitor 9. Therein the voltage which is actually produced at capacitor 9 can be supplied via a lead 21 as feedback voltage with respect to the input voltage at 19 to the pulse duration modulator 18. The inductance 13 with the switch 14 and the modulator 18 constitute together a switching modulator 22, which supplies in accordance with the invention the voltage for capacitor 9 with a minimum of power losses.

FIG. 2 shows a diode modulator in which a direct current flows to capacitor 9 so that the value of the capacitor voltage $U_c$ can be changed by means of a controlled load. In this circuit the negative pole of the voltage source $V_B$ of, for example, 140 V is grounded, its positive pole being connected to a point A via a supply inductance 30 of, for example, 9 mH. A scan capacitor 31 of, for example, 1.2 $\mu$F is connected to point A, the other terminal of this capacitor being connected to the line deflection coil Ly of, for example, 1.2 mH which is connected to ground via the compensation coil L' of, for example, 450 $\mu$H. Between a point F and the junction of coils Ly and L' the capacitor 9, of for example, 1.2 $\mu$F is connected, upon which capacitor the modulation voltage is present — Point F is connected via the cathode-anode-path of a diode 32 to ground and via the anode-cathode-path of a diode 33 and an inductance 34 to a load network whose other side is connected to earth and which consists of a capacitor 35 and a parallel resistor 36. Inductance 34 is magnetically coupled with inductance 30. The terminal of the capacitor 9 which is shown in the right-hand part of FIG. 2 is D.C. connected to ground via coil L'; the left-hand terminal is connected from point F via an inductance 39 to the point G which supplies the desired voltage varying at field frequency to capacitor 9. As capacitor 9 carries a deflection A.C. voltage with respect to chassis, the inductance 39 is required for decoupling the D.C. voltage-supply circuit present at to point G.

The switch 38 is closed during the scan so that inductance 30 is connected to the supply voltage $V_B$ in such a way that the end of inductance 30 which is marked at left by a dot is positive with respect to the end which is connected to point A and which is connected to earth via switch 38. A sawtooth-shaped increasing current flows through the inductance 30 in accordance with the D.C. voltage connected to it. During the flyback switch 38 is open. Then the voltage at point A performs with the capacitance 38a, which may be formed by stray capacitances and which operates in particular parallel with the opened switch 38, a pulse-shaped oscillation which approximately resembles the top of a sine, which oscillation reached for example, a positive peak value of 1200 volts; during the scan time the voltage at point A is zero owing to the closed switch 38. Consequently, at the point A there is a pulse train which is clamped to the earth potential, the D.C. voltage component of this train having the value of the supply voltage $V_B$; the left-hand terminal of capacitor 31 is charged to this value whereas its righthand terminal is D.C. connected to earth via the coils Ly and L'.

The positive pole of capacitor 31 is connected to ground during the scan and its negative voltage of −140 V is connected to the series arrangement of coils Ly and L'. The left-hand terminal of capacitor 9 is connected to ground via the diode 32 during the negative part of approximately sawtooth-shaped, alternating current originating from capacitor 9, so that also point F is clamped to earth in a corresponding manner. The diode 33 whose cathode is connected to the series arrangement of inductance 34 and the parallel RC network 35, 36 is conductive for the other current direction. As inductance 34 is coupled to the inductance 30 it carries a voltage of a similar form with such a polarity that its lower end is positive during the scan and negative in a pulse-like manner during the flyback as illustrated by the adjacent diagram 34a. Owing to the diodes 33 and 32 the upper end of inductance 34 can substantially not become more negative than chassis so that a (positive) charge of capacitor 35 occurs on the scan voltage which is produced at inductance 34. The portion of the sawtooth current of the capacitor 9 which flows through the diode 33 charges capacitor 35, whilst a current is taken off by resistor 36 which may be constituted by another stage.

During the flyback a positively directed flyback pulse is produced as mentioned above at coils Ly and L' as the result of an oscillation with the parallel operating capacitance 38a. This is shown at 37 for the righthand connection of capacitor 9. The positive-going flyback pulse 37 is transferred via capacitor 9 to point F at which an oscillation in accordance with diagram 37' is produced; the flyback pulses thereof, which may amount to, for example, a maximum of 350 V peak-to-peak, cut diode 32 off. At inductance 34 a flyback pulse is produced whose low end is negative, whose upper end is therefore positively-directed with respect to the D.C. voltage at capacitor 35 and which exceeds the pulse peak of voltage 37': consequently the diode 33 is also cut off.

In this known arrangement the circuit $V_B$, 30, A, 38 is during the scan closed and isolated from the deflection circuit. Energy is supplied in the flyback period when switch 38 is open: then a current flows during the above-described sinusoidal flyback voltage from inductance 30 to flyback capacitance 38a and consequently into the oscillation circuit which comprises the coils Ly and L' so that at the beginning of the next scan period the sawtooth current starts with an amplitude which is higher than that during the preceding scan period. In the flyback period the branch which comprises the coils Ly and L' consists of two portions which have given impedance values for the flyback oscillation which correspond to the partial capacitances and dampings associated with the coils. The flyback energy which is supplied to these portions is divided in accordance with the ratio of these impedances and is stored during the flyback period in the coils Ly and L'.

During the subsequent scan switch 38 and diode 32 or 33 are conductive so that the voltage of capacitor 31, reduced by the voltage of capacitor 9 is parallel with coil Ly whereas only the voltage of capacitor 9 is connected to coil Ly. The voltage at capacitor 31 is equal to the supply voltage $V_B$. The flyback voltage is distributed over coils Ly and L' in accordance with the partial impedances which are effective for the flyback oscillation. The scan voltage amounts to a fraction of the flyback voltage depending on the ratio between the flyback time and the scan time. As a result a given voltage is produced at capacitor 9 which voltage in the embodiment cannot be higher than 38 volts. When current is withdrawn from capacitor 9 a current flows during the flyback from the deflection part which current is limited as it must flow through the impedance constituted by the coil Ly. It is consequently possible to modulate in known way the voltage of capacitor 9 in a desired manner by means of a controlled load which is connected to the point F via an isolation coil 39 such that the difference between the voltages at capacitors 31 and 9 supplies the required variation for the scan voltage and consequently for the sawtooth amplitude of the deflection current.

In the prior art circuit the point F which carries the deflection A.C. voltage and the above-mentioned capacitor - D.C. voltage is connected via an inductance 39, which isolates the A.C. voltage, to the terminal G with a controllable load, for example a transistor, to whose base the voltage 20 of the vertical frequency is applied. Current and voltage produce considerable losses in the collector-emitter path of the transistor.

In accordance with the invention a switch-modulator 40 is connected to point G. The approximately parabolic control signal 20 at field frequency is applied to a terminal 41 of this switch-modulator. Signal 20 is converted into a train of square pulses 45 at line frequency like a signal applied at a terminal 43 by means of a pulse duration modulator 42 which is similar to the modulator 18 in FIG. 1. The pulses 45 drive periodically the base of a transistor 44, whose emitter is connected to ground, either into saturation or into the cut-off state so that point G is temporarily connected to ground at line frequency. In addition, the collector of the transistor 44 is connected to the anode of a diode 46, whose cathode is connected to a capacitor 47 whose other end is grounded and with which a load resistor 48 is connected in parallel.

In the periods in which transistor 44 is fully driven a current flows from the point F carrying the D.C. voltage through the inductance 39 and the transistor 44 to ground. The inductance has with the parasitic capacitances a self-resonant frequency which is much greater, for example 20 to 100 times, than the switching frequency. If transistor 44 is cut-off the voltage at point G increases steeply, in a similar manner as does a line flyback pulse at the deflection coil, until it exceeds the voltage at capacitor 47 so that diode 46 can pass current. As a result of the magnetic energy which has accumulated in inductance 39 an approximately sawtooth-shaped decreasing current flows to capacitor 47. Resistor 48 absorbs the average value of the energy supplied. It may also be partly replaced by another stage of the television receiver and feed the latter. Capacitor 47 is preferably of such a value that its discharge time constant together with resistor 48 is high with respect to the period of the field frequency so that a substantially constant voltage is produced at it.

The voltage at point F carries the entire D.C. voltage part of 38 V which is determined by the remaining part of the circuit in the case that transistor 44 is permanently cut-off and diode 46 is in the non-conductive state due to a more positive cathode voltage: then the trace voltage (in 37) which is produced at the junction of the coils L' and Ly and which is transferred by means of capacitor 9 is clamped, as mentioned above, to the ground potential by means of diodes 32 and 33 so that a given average D.C. voltage is produced at point F. If, however, modulator 40 takes up current via point G then the capacitor voltage decreases and may fall practically to zero when the transistor 44 is permanently conductive. Consequently, a higher voltage is applied during the trace to coil Ly, said voltage being the difference between the voltage at capacitors 31 and 9 so that the required increase in the line deflection amplitude is obtained. As the voltage at point G rises steeply like a flyback pulse diode 46 is opened substantially for each (also a very low) D.C. voltage value at point F. Consequently the voltage at point F is modulated by the switching intervals of transistor 44, for example between 8 V and 28 V.

For a proper operation the voltage at the cathode of diode 46 must be slightly higher, for example 10 to 30%, than the highest voltage required at capacitor 9, which voltage cannot be higher than the value which results from the layout of the circuit. Even then, owing to the pulse-like oscillation when transistor 44 is cut off, energy can flow back via the cathode of the diode (46) also to a higher voltage (47).

As in the modulator 40 the point G is alternatingly connected to defined voltages, namely to that of chassis or to that of capacitor 47, the D.C. voltage for the capacitor 9 is, as in FIG. 1 imposed from the outside and does not depend on the current or voltage values which are determined by the deflection circuit; these values only affect the current which flows to the switch-modulator 40.

In the circuit shown a RC network 35, 36 is already present at which a positive voltage of, for example, 30 V is produced: as indicated by dashed lines 50 the two RC networks 35, 36 and 47, 48 can be interconnected or combined respectively.

Particularly when there is, for example, a risk for a non-linear relation (modulation distortions) a D.C. voltage can be fed back to modulator 42 from point F via a lead 53 or from point G and be compared there with the input voltage 20.

The required blocking of diode 33 by means of positive pulses at its cathode can also be obtained by connecting it to the point A as shown by the dotted connection; the lead with inductance 34 and the RC network 35, 36 can then be dispensed with.

As by means of the switch modulator 40 according to the invention the current from terminal G is either fed directly to ground or to a separate load 48 the dissipation in the modulating transistor 44 is low; the currents produced cause, as decharging currents of capacitors, power losses which are low and divided over the deflection stages or can be utilized in other places.

As in the circuit of FIG. 2 a deflection current having a high positive flyback pulse is produced at point F, inductance 39 should normally be correspondingly large so that the deflection is not impermissibly loaded by the low impedance at the point G or the modulator disturbed by the high flyback pulses. In addition, the situation is obtained that also with a permanently cut-off transistor 44 during the high positive flyback pulses produced at point F diode 46 will be opened and a current will flow which reaches its maximum at the beginning of the scan whereafter it slowly decreases. This current whose average value may amount to approximately 20% of the maximum modulation capability of the current narrows down the drive range of the capacitor voltage and hence the line amplitude. This drawback can be mitigated by means of a further elaboration of the invention by providing between the point F or capacitor 9 and switch-modulator 40 with output terminal G a winding 52 which is magnetically coupled to a part of the deflection circuit, for example the compensation coil L' or the supply coil 30 or a possible line deflection transformer, not shown, such that in this winding an A.C. voltage is induced which is equally large as the flyback pulse at capacitor 9 but of the opposite sense. Then no pulse or a considerably smaller pulse will be produced at point G. The inductance 39, possibly with the addition of the inductance of winding 52 then mainly serves for decoupling the scan voltage introduced in the circuit via winding 52 and to smooth, with respect to capacitor 9, the switching A.C. voltage produced at point G. As the switching voltage and the deflection voltage preferably have the same frequency the risk of impermissible influences is slight.

In an efficient manner the feedback for the modulator 42 is taken off from point H between 39 and 52 via the dashed connection and the lead to point F is interrupted in accordance with the dashed cross. The flyback pulses or the deflection voltages obtained from winding 52 are compensated at point H and the switching voltages are smoothed by inductance 39 so that the feedback D.C. voltage derived need only be smoothed to a slight extent. Owing to the above-mentioned compensation at point H it may be possible to omit the capacitor 9 and to connect a capacitor 9' between point H and ground instead. Then the capacitor D.C. voltage is active, as before, between point F and the junction of coils Ly and L', approximately the same voltage as the A.C. voltage with respect to earth being added via L' and 52.

As described so far correction for pin-cushion distortion in the East-West direction, current through the line deflection coil Ly is reduced about the beginning and end of a field scan period. The circuit may also operate with correction circuits which increase the current through the line deflection coil Ly about the centre of a field scan period. In such a case for example FIG. 2 could be modified to connect the common line for components D', Dr', Ct', D2, C4 and R of said application to a negative supply rail, the voltage across capacitor C3 then being a negative going parabola below zero potential. Transistor Tr2 in such a case may either be connected in reverse or replaced by a p.n.p. transistor.

The circuit above are described for the correction of pin-cushion distortion in the East-West direction. It will be clear that it can also be used for other forms of correction, for example for stabilizing the amplitude of the deflection current against mains supply voltage fluctuations and E.H.T. variations. These may be attained at the same time as obtaining pin-cushion correction.

What is claimed is:

1. A circuit arrangement for generating from a supply voltage source a sawtooth deflection current through a line deflection coil, said circuit comprising a line deflection circuit including switching means operating at line frequency for periodically applying a voltage to said line deflection coil for the production of said deflection current, and modulating means adapted to be coupled to said deflection coil circuit for modulating the magnitude of the voltage across the deflection coil during the line scan period thereby modulating the amplitude of the deflection current, said modulating means including a stage operating in the switching mode, and a switch controlled by periodic pulses for alternately driving said switch into conduction and cutting it off and adjusting the duration of the controlling pulses depending on the voltage present at the modulating means output terminals; a scan capacitor, said supply voltage source being adapted to be coupled to said scan capacitor for supplying a part of the voltage applied to the line deflection coil, said modulating means providing a pulse-shaped current switched between two values to the scan capacitor an inductance means coupled to said modulations means for smoothing the switching frequency, and a winding coupled to the scan capacitor, said winding being magnetically coupled to the line deflection circuit.

2. A circuit arrangement as claimed in claim 1, further including a comparator means for comparing a feedback voltage originating from the scan capacitor voltage to a reference voltage, the feedback voltage being derived between said winding and the smoothing inductance.

3. A circuit arrangement as claimed in claim 1, the scan capacitor being coupled between a junction of said winding and the smoothing inductance.

* * * * *